(12) United States Patent
Park et al.

(10) Patent No.: US 9,130,030 B1
(45) Date of Patent: Sep. 8, 2015

(54) BAKING TOOL FOR IMPROVED WAFER COATING PROCESS

(71) Applicant: Applied Materials, Inc., Santa Clara, CA (US)

(72) Inventors: Jungrae Park, Santa Clara, CA (US); Wei-Sheng Lei, San Jose, CA (US); James S. Papanu, San Rafael, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/200,918

(22) Filed: Mar. 7, 2014

(51) Int. Cl.
*H01L 21/46* (2006.01)
*H01L 21/78* (2006.01)
*B23K 26/36* (2014.01)
*B23K 10/00* (2006.01)

(52) U.S. Cl.
CPC ............... *H01L 21/78* (2013.01); *B23K 10/00* (2013.01); *B23K 26/367* (2013.01)

(58) Field of Classification Search
CPC ...... H01L 21/3043; H01L 21/78; H01L 21/82
USPC .......................... 438/458, 460, 462, 463, 464
See application file for complete search history.

(56) References Cited

U.S. PATENT DOCUMENTS

| | | | |
|---|---|---|---|
| 4,049,944 A | 9/1977 | Garvin et al. | |
| 5,284,792 A * | 2/1994 | Forster et al. | ................... 438/29 |
| 5,593,606 A | 1/1997 | Owen et al. | |
| 6,057,180 A | 5/2000 | Sun et al. | |
| 6,117,347 A * | 9/2000 | Ishida | ............................ 216/52 |
| 6,174,271 B1 | 1/2001 | Kosmowski | |
| 6,306,731 B1 | 10/2001 | Igarashi et al. | |
| 6,407,363 B2 | 6/2002 | Dunsky et al. | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |

(Continued)

FOREIGN PATENT DOCUMENTS

| | | |
|---|---|---|
| EP | 0675918 | 6/1995 |
| JP | 9216085 | 8/1997 |

(Continued)

OTHER PUBLICATIONS

Linder, V. at al., "Water-Soluble Sacrificial Layers for Surface Micromachining", www.small-journal.com, 2005, 1, No. 7, 7 pgs.

(Continued)

*Primary Examiner* — Kevin M Picardat
(74) *Attorney, Agent, or Firm* — Blakely, Sokoloff, Taylor & Zafman (57) ABSTRACT

Baking methods and tools for improved wafer coating are described. In one embodiment, a method of dicing a semiconductor wafer including integrated circuits involves coating a surface of the semiconductor wafer to form a mask covering the integrated circuits. The method involves baking the mask with radiation from one or more light sources. The method involves patterning the mask with a laser scribing process to provide a patterned mask with gaps, exposing regions of the substrate between the ICs. The method may also involves singulating the ICs, such as with a plasma etching operation.

24 Claims, 8 Drawing Sheets

(56) References Cited

U.S. PATENT DOCUMENTS

| | | |
|---|---|---|
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,927,973 B2 | 4/2011 | Haji et al. |
| 2003/0077878 A1* | 4/2003 | Kumar et al. ............... 438/460 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2006/0043535 A1 | 3/2006 | Hiatt |
| 2006/0205182 A1 | 9/2006 | Soejima |
| 2009/0255911 A1 | 10/2009 | Krishnaswami et al. |
| 2011/0312157 A1 | 12/2011 | Lei et al. |
| 2012/0322234 A1* | 12/2012 | Yalamanchili et al. ....... 438/462 |

FOREIGN PATENT DOCUMENTS

| | | |
|---|---|---|
| JP | 10321908 | 12/1998 |
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet at al., "Apparatus and Methods for Dry Etch With Edge, Side and Back Protection", U.S. Appl. No. 61/491,693, filed May 31, 2011 24 pgs.

Darling, R. B., Lecture notes on photolithography, http://users.wfu.edu/ucerkb/Nan242/L15-Photolithography.pdf, Apr. 5, 2010, 33 pages.

* cited by examiner

BAKING TOOL FOR IMPROVED WAFER COATING PROCESS

BACKGROUND

1) Field

Embodiments of the present invention pertain to the field of semiconductor processing and, in particular, to methods of improved wafer coating.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits; three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

Some alternative dicing methods may involve application of a mask via spin-coating prior to further processing operations. However, conventional spin-coating techniques for such mask application can result in residue on the backside of the wafer, resulting problems such as misalignment during the later processing operations.

SUMMARY

One or more embodiments of the invention are directed to a baking method and tool for an improved wafer coating process. In one embodiment, the baking method and tool are used to bake a mask formed for a wafer dicing process.

According to one embodiment, a method of dicing a semiconductor wafer including integrated circuits involves coating a surface of the semiconductor wafer to form a mask covering the integrated circuits. The method involves baking the mask with radiation from one or more light sources. The method also involves patterning the mask with a laser scribing process to provide a patterned mask with gaps, exposing regions of the substrate between the ICs. The ICs may be singulated by, for example, further laser scribing, or plasma etching.

In one embodiment, a method of dicing a substrate including integrated circuits involves forming a mask over the substrate with a wet-coating process. The mask covers the integrated circuits. The method involves heating the mask with one or more light sources, drying the mask. The method includes patterning the mask with a laser scribing process to provide a patterned mask with gaps, exposing regions of the substrate between the ICs. The method further includes plasma etching the substrate through gaps in the patterned mask.

In another embodiment, a method of dicing a semiconductor wafer involves coating a surface of the semiconductor wafer to form a mask covering the ICs and baking the mask with radiation from one or more light sources. The method involves patterning the mask to provide a patterned mask with gaps, exposing regions of the semiconductor wafer between the ICs. The method further involves etching the semiconductor wafer through the gaps in the patterned mask to singulate the ICs.

In one embodiment, a system for dicing a substrate including a plurality of ICs includes a mask formation module configured to form a mask over the substrate. The system includes a baking chamber with a support structure to hold the substrate in the baking chamber and one or more light sources configured to heat the mask. The system further includes a laser scribe module configured to pattern, with a laser scribe process, the mask to form a trench exposing regions of the substrate between the ICs.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Methods, apparatuses, and systems for baking for an improved wafer coating process are described. In the following description, numerous specific details are set forth, such as exemplary mask materials and laser plasma dicing methods in which an improved baking tool may be used, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

When dicing wafers that are 300 μm or thicker, the wafers are rigid enough to be directly placed on mounting tapes without die attach film (DAF). In circumstances where wafers are placed on mounting tapes without DAF, no DAF cutting process is involved. Embodiments described herein address the dicing applications of integrated circuit (IC) wafers (e.g., integrated wafers with processor chips) that have a thickness of 250 μm to 800 μm. Furthermore, embodiments address dicing applications of integrated circuit wafers with an acceptable dicing kerf width of 50 μm to 200 μm width, preferably 50 μm to 100 μm measured on the wafer front surface. A kerf width of 50 μm to 100 μm measured on the wafer front surface corresponds to a typical kerf width measured from the back side of the wafer of 30-50 μm in a laser/saw hybrid process.

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. Thus, in one embodiment, a method uses a hybrid approach employing laser scribing and plasma etching to dice the wafers. The laser scribing removes difficult-to-etch passivation layers, dielectric layers, and metal layers until the underlying silicon substrate is exposed. Plasma etching generates trenches of a depth to the target die thickness. In another embodiment, the laser etch process may involve ablating, with the laser scribing process, the entire thickness of the substrate, followed by plasma etching the substrate surfaces exposed by the laser scribing process. In one such embodiment, the plasma etching may remove semiconductor damaged by the laser ablation to improve die strength.

Thus, according to embodiments, wafer dicing methods use both laser scribing and plasma etching instead of only laser scribing or blade sawing to generate trenches in a semiconductor wafer. The laser plasma wafer dicing methods involve forming a mask (e.g., a water soluble mask) over the semiconductor wafer to protect the integrated circuits (and in some embodiments, to protect bumps or pads) from being exposed during laser scribing and/or plasma etching. The mask layer may be formed by a variety of techniques, including wet-coating techniques such as spin-coating. Some coating techniques involve a subsequent baking or curing process.

Figure 1:
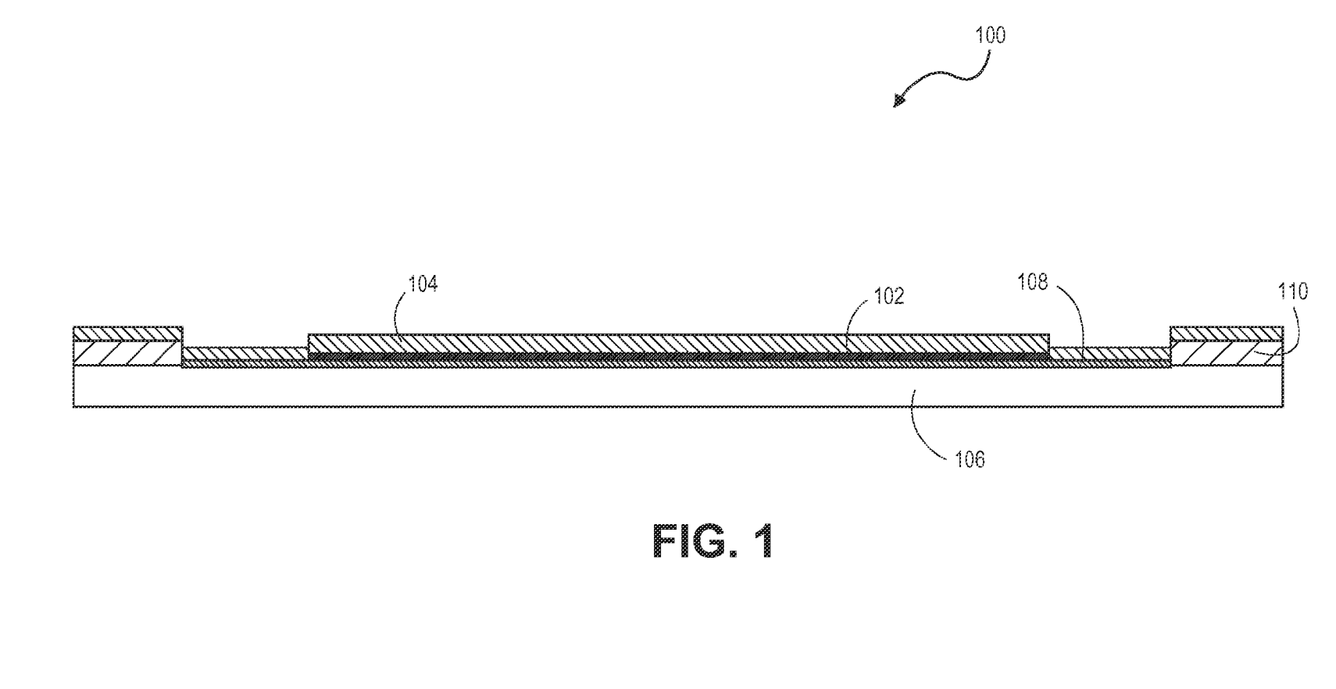
FIG. 1 is a cross-sectional view of a wafer disposed over a conventional hot plate.

For example, FIG. 1 illustrates a conventional system 100 used to bake or cure a film formed over a semiconductor wafer 102. According to a method using the conventional system 100 of FIG. 1, a semiconductor wafer 102 coated with a mask 104 is placed on a hot plate 106. FIG. 1 is a cross-sectional view of the semiconductor wafer 102 disposed over a conventional hot plate 106. The semiconductor wafer 102 is coupled to a wafer frame 110 with adhesive tape (e.g., dicing tape) 108. The hot plate is heated, which heats the backside of the semiconductor wafer 102 through the adhesive tape 108. The heat from the backside of the semiconductor wafer 102 is then conducted through the semiconductor wafer 102 to heat the mask 104. Thus, the adhesive tape 108, the wafer frame 110, and the entire semiconductor wafer 102 are all heated to dry or cure the mask 104. Using the hot plate to dry or cure the mask 104 can take a substantial amount of time for each semiconductor wafer (e.g., 5-10 minutes for each semiconductor wafer). Additionally, a given hot plate may only be used for one semiconductor wafer at a time. Thus, using a conventional hot plate to dry or cure the mask is inefficient and can limit manufacturing throughput.

Conventional hot plates use wound resistive heating wires as heating elements, which typically result in a non-uniform heating surface. The non-uniform heating surface results in non-uniform heating of the semiconductor wafer 102. Even if the hot plate 106 were able to provide uniform heating, impurities in the semiconductor wafer 102, in the interface between the semiconductor wafer 102 and the mask 104, or the mask 104, may result in non-uniform heating of the mask 104. Non-uniform heating of the mask 104 may result in voids in the mask 104 caused by moisture or air bubbles that become trapped as the mask 104 dries or cures. Voids in the mask 104 may lead to mask integrity issues, which can cause punch-through holes on the wafer surface during subsequent etching processes.

Furthermore, the contact plane of the backside of the semiconductor wafer 102 can become adhered to the hot plate 106 due to outgassing of the adhesive tape 108 or coating residue from the coating process. Therefore, detachment of the semiconductor wafer 102 from the surface of the hot plate 106 can be difficult and may result in damage to the semiconductor wafer 102. Such residues may lead to transfer issues due to contamination of robot blades used to transfer the semiconductor wafers.

According to embodiments of the invention, a light source is used to heat a mask. In one embodiment, the light sources heat the mask from a top surface of the mask, which avoids the non-uniformities arising from heating the mask through the backside of the semiconductor wafer and tape with a hot plate. Unlike the conventional baking process described above, the mask can be heated uniformly and with minimal void formation in the mask.

Figure 2:
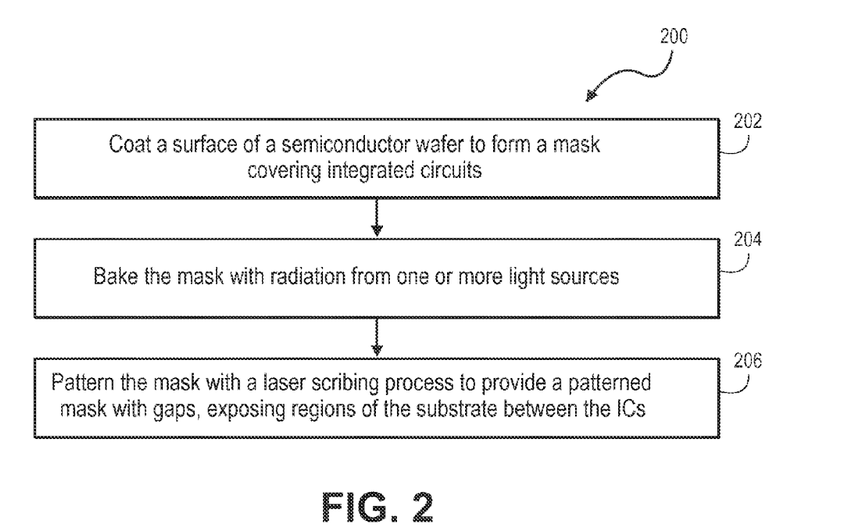
FIGS. 2 and 3 are flowcharts illustrating a method of dicing a semiconductor wafer including a plurality of integrated circuits, in accordance with embodiments of the present invention.
Figure 3:
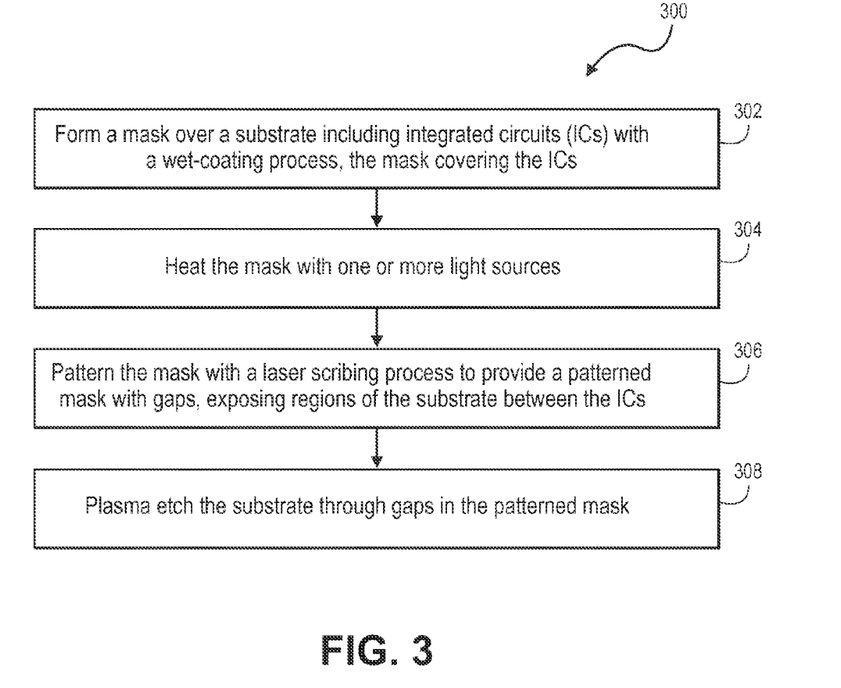
Figures 4A, 4B:
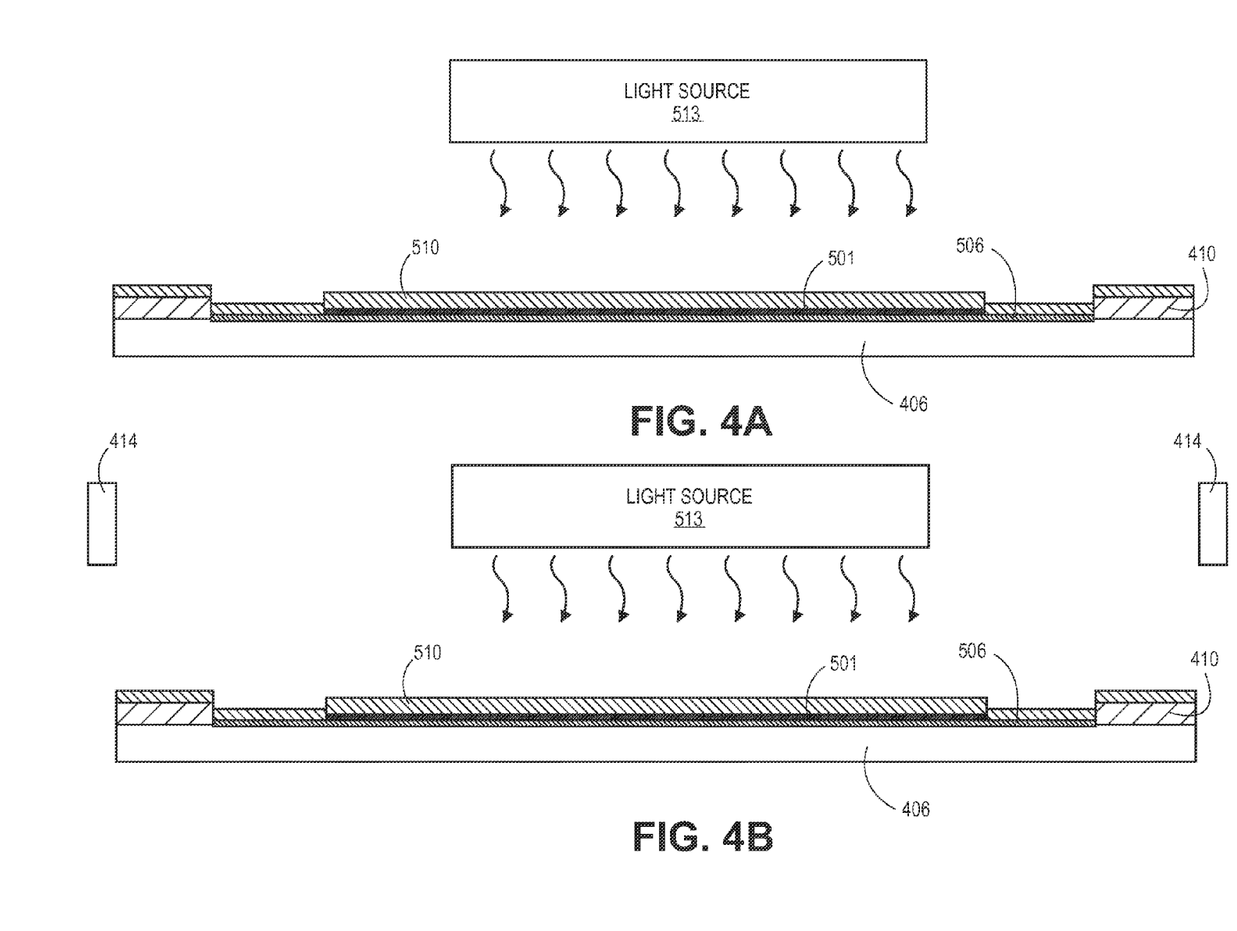
FIGS. 4A and 4B illustrate cross-sectional views of a baking tool, in accordance to embodiments of the present invention.

FIGS. 2 and 3 are flowcharts illustrating a method of dicing a semiconductor wafer including baking of a mask, in accordance with embodiments of the present invention. FIGS. 4A and 4B illustrate cross-sectional views of a baking tool that may be used in the dicing methods of FIGS. 2 and 3, in accordance to embodiments of the present invention. FIGS. 5A, 5B, 5C, 5D, and 5E illustrate cross-sectional views of a semiconductor wafer including a plurality of integrated circuits during performance of a method of dicing the semiconductor wafer, corresponding to operations of FIGS. 2 and 3, in accordance with embodiments of the present invention.

Figure 5A:
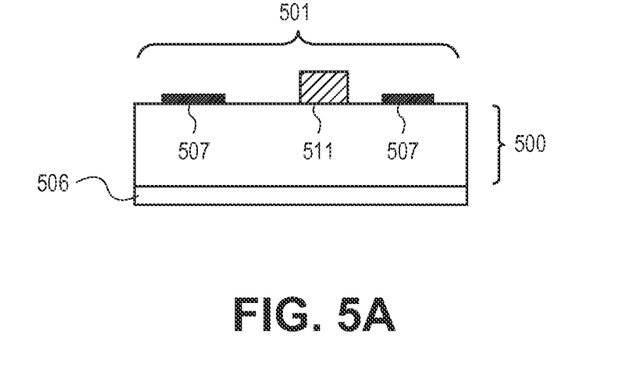
FIGS. 5A, 5B, 5C, 5D, and 5E illustrate cross-sectional views of a semiconductor wafer including a plurality of integrated circuits during performance of a method of dicing the semiconductor wafer, corresponding to operations of FIGS. 2 and 3, in accordance with embodiments of the present invention.

The method 200 of FIG. 2 begins with a semiconductor wafer including integrated circuits, such as the semiconductor wafer 501 illustrated in FIG. 5A. The semiconductor wafer 501 is disposed on an adhesive tape 506 and coupled with a wafer frame or other carrier with the adhesive tape 506. The adhesive tape 506 may include, for example, a base material and a release layer (e.g., a thermal or UV curable layer). According to one embodiment, the semiconductor wafer 501 has a diameter of at least 300 mm and has a thickness of 250 µm to 800 µm. The semiconductor wafer 501 has disposed on or in the substrate 500, a portion of integrated circuits 507, which include semiconductor devices. Examples of such semiconductor devices include, but are not limited to, memory devices or complementary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps or pads 511 and passivation layers may be formed above the interconnect layers. The conductive bumps or pads 511 may include solder balls.

Figure 6:
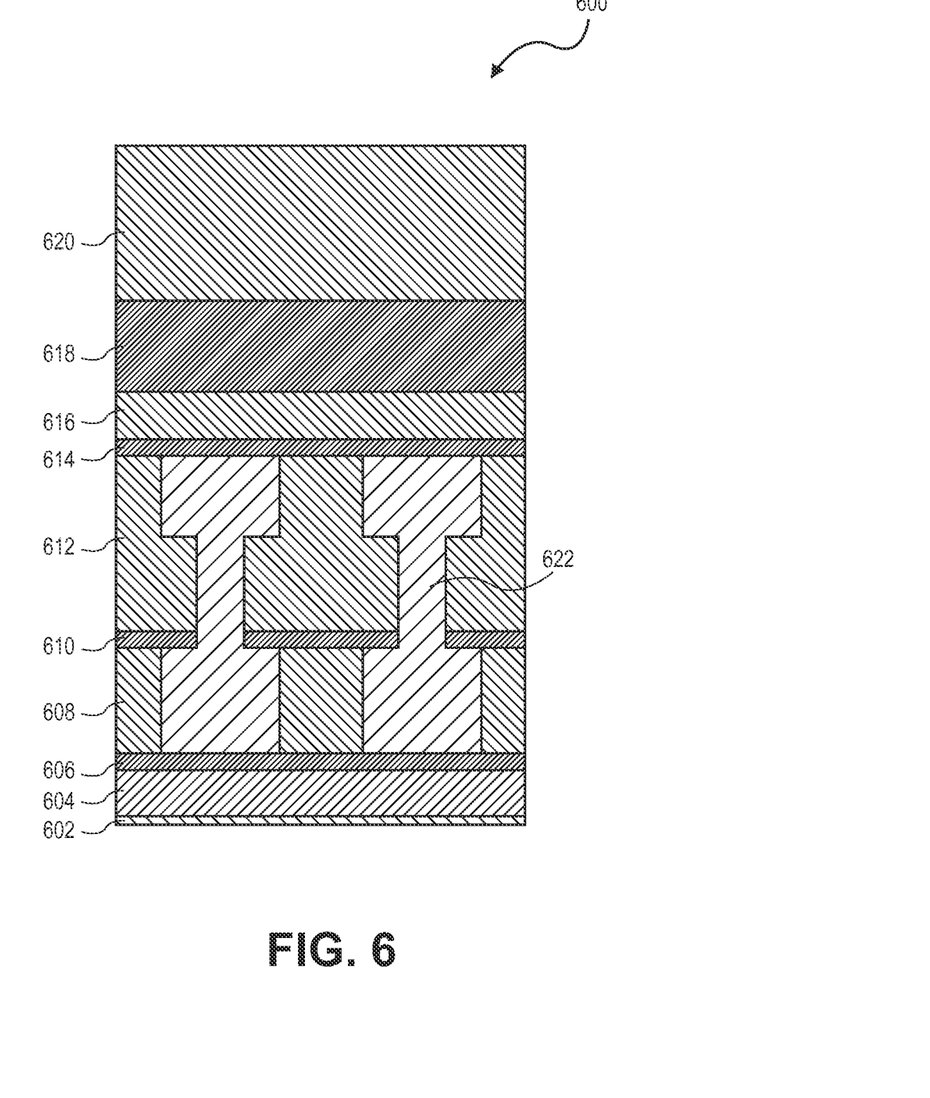
FIG. 6 illustrates a cross-sectional view of a stack of materials that may be present in a street region of a semiconductor wafer or substrate, in accordance with embodiments of the present invention.

Materials making up the streets between the integrated circuits 507 may be similar to or the same as those materials used to form the integrated circuits 507. For example, streets may be composed of layers of dielectric materials, semiconductor materials, and metallization. In one embodiment, one or more of the streets includes test devices similar to the actual devices of the integrated circuits. FIG. 6 illustrates a cross-sectional view of an exemplary stack of materials that may be used in a street region of a semiconductor wafer or substrate, in accordance with an embodiment of the present invention. Referring to FIG. 6, a street region 600 includes the top portion 602 of a silicon substrate (e.g., a portion of the semiconductor wafer or substrate 500) a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photo-resist 620, with relative thicknesses depicted. Copper metallization 622 is disposed between the first and third etch stop layers 606 and 614 and through the second etch stop layer 610. In a specific embodiment, the first, second and third etch stop layers 606, 610, and 614 are composed of silicon nitride, while low K dielectric layers 608 and 612 are composed of a carbon-doped silicon oxide material.

Figure 5B:
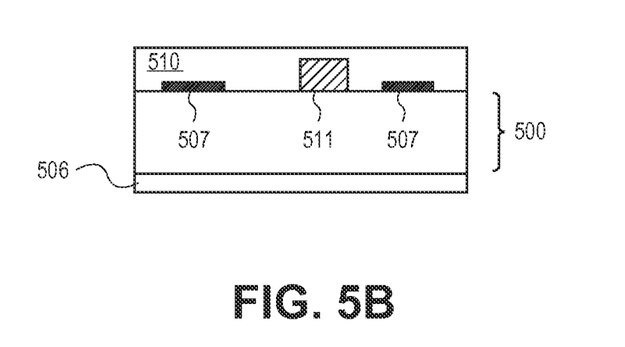

Returning to FIG. 2, the method 200 involves coating a surface of the semiconductor wafer 501 to form a mask 510 covering the integrated circuits 507, at operation 202 and corresponding to FIG. 5B. Similarly, the method 300 of FIG. 3 includes forming a mask 510 over a substrate 500 with a wet-coating process, at operation 302. The mask 510 may also protect the bumps or pads 511 projecting or protruding up from the surface of the semiconductor wafer 501. Additionally, the mask 510 may cover intervening streets formed between adjacent ones of the integrated circuits 507. According to embodiments, the mask 510 is formed by a wet-coating process such as spin-coating, screen printing, spray coating, or other coating techniques involving subsequent heating to cure or dry the mask. According to embodiments, the mask may be formed from a polymer (e.g., a water-soluble polymer), including one or more of poly(vinyl alcohol) (PVA), poly(acrylic acid), poly(methacrylic acid), poly(acrylamide), and poly(ethylene oxide). Other embodiments may include masks formed from other materials suitable for protecting the ICs during subsequent laser and/or plasma etching operations.

Figure 5C:
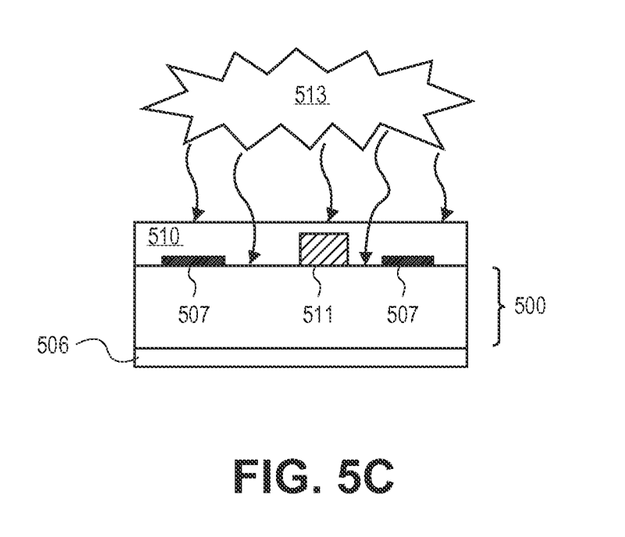

After coating the semiconductor wafer 501 with the mask 510, the method 200 involves baking the mask with radiation from one or more light sources 513, at operation 204 and corresponding to FIG. 5C. Similarly, the method 300 involves heating the mask with one or more light sources to dry the mask 510, at operation 304 and corresponding to FIG. 5C. In one embodiment, the one or more light sources are located above the semiconductor wafer. For example, FIGS. 4A and 4B illustrate embodiments with a light source 513 located above the semiconductor wafer 501. In the illustrated embodiments, the semiconductor wafer 501 is coupled to a wafer frame 410 with adhesive tape (e.g., dicing tape) 506. A mask (or other film) 510 is disposed over the semiconductor wafer 501. The light source 513 generates light that heats the mask 510 from above. In one embodiment, the light source 513 is an array of light emitting diodes (LEDs). The light source 513 may emit light in the infrared, visible, ultra-violet (UV), or other spectrums, according to embodiments.

In addition to heating the mask with the light sources, the methods 200 and 300 may further include supporting the semiconductor wafer 501 in an oven chamber, and heating the oven chamber with heating elements while heating the mask with the light source 513. FIG. 4B illustrates an example of an oven chamber with heating elements 414 in addition to the light source 513. The heating elements 414 may be non-contact heating elements that indirectly heat the semiconductor wafer 501 by heating an ambient gas (e.g., air, nitrogen, or some other gas capable of convective heat transfer) around the semiconductor wafer 501. For example, the heating elements 414 may be disposed at one or more locations around the semiconductor wafer 501 without contacting a stage 406 supporting the semiconductor wafer 501 in the oven chamber.

Returning to FIG. 5C, in one embodiment, baking the mask includes irradiating the mask with light having a first wavelength that is absorbed by the mask 510 and a second wavelength that is transmitted by the mask 510. The light that is absorbed by the mask 510 heats up the mask 510 directly, and the light that is transmitted by the mask 510 is absorbed by the top side of semiconductor wafer 501. The light absorbed by the top side of the semiconductor wafer 501 results in heating of the top side of the semiconductor wafer 501, which heats the bottom side of the mask 510. Therefore, in one such embodiment, the mask 510 is heated from both the top and from the bottom, but without first heating the adhesive tape 506 and the back side of the semiconductor wafer 501. Therefore, embodiments achieve more efficient heating of the mask 510 without the generation of voids and without the wafer transfer issues associated with a conventional hot plate.

Thus, the semiconductor wafer may be supported over a non-hot-plate stage while heating the mask with the one or more light sources. However, in other embodiments, the baking method may involve both an overhead light source 513, and supporting the semiconductor wafer 501 on a heated stage. In one such embodiment, the semiconductor wafer may be heated simultaneously from below through the heated stage and from above with the light source. However, as explained above, heating through the tape 506 and the backside of the semiconductor wafer 501 may have disadvantages if the stage is heated to a high enough temperature (e.g., if the stage is heated to a temperature that causes excessive outgassing from the adhesive tape 506). Therefore, in one embodiment employing both a heated stage and the overhead light source 513, the stage may be heated to a lower-than-typical temperature to achieve faster baking than with either heat source alone, but without the non-uniformities associated with hot plates.

Furthermore, although a single semiconductor wafer 501 is depicted in FIGS. 4A, 4B, and 5A-5E, in one embodiment, the method involves simultaneously heating a plurality of masked semiconductor with the light source 513.

Figure 5D:
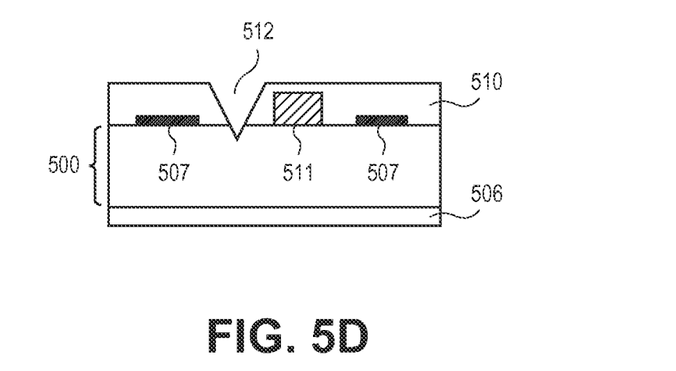
Figure 5E:
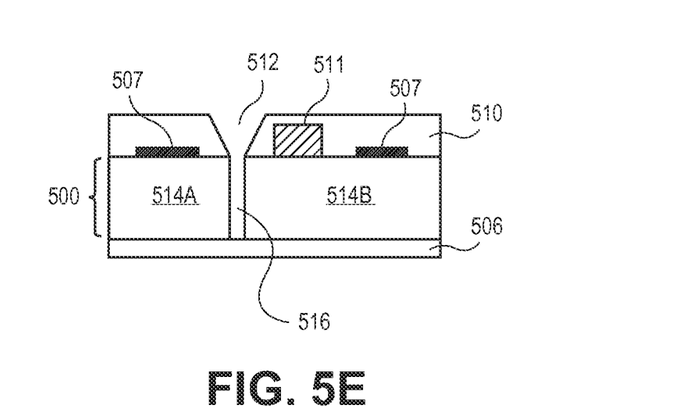

Turning again to FIG. 2 and to corresponding FIG. 5D, the method 200 continues at operation 206 with patterning the mask with a laser scribing process to provide a patterned mask with gaps, exposing regions of the substrate between the ICs. Similarly, the method 300 of FIG. 3 includes patterning the mask with a laser scribing process, at operation 306. The laser scribing process exposes regions 512 (e.g., gaps or trenches) of the semiconductor wafer between the ICs 507. To minimize dielectric delamination and cracking, a femtosecond laser may be preferred. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

The laser scribing process is performed generally to remove the material of the streets present between the integrated circuits. In accordance with an embodiment of the present invention, patterning the mask 510 with the laser scribing process includes forming the trenches 512 partially into the regions of the semiconductor wafer 501 between the integrated circuits 507. In an embodiment, patterning the mask with the laser scribing process includes direct writing a pattern using a laser having a pulse width in the femtosecond range. Specifically, a laser with a wavelength in the visible spectrum (e.g., green band, or 500-540 nm) or the ultra-violet (UV, or 300-400 nm band) or infra-red (IR) band (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask, the streets and, possibly, a portion of the semiconductor wafer or substrate.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

Under conventional laser irradiation (such as nanosecond-based or picosecond-based laser irradiation), the materials of the street may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In another embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µA, although preferably approximately in the range of 10 to 50. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to (e.g., 500-540 nm), or in the UV range (e.g., 300-400 nm) provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

After performing the laser scribing process of operations 206 of FIGS. 2 and 306 of FIG. 3, the ICs may then be singulated by, for example, a further laser scribing operation, or plasma etching. For example, the method 300 further involves plasma etching the substrate through gaps in the patterned mask to etch entirely through semiconductor wafer 501, at operation 308 and corresponding to FIG. 5E. In the exemplary embodiments illustrated by FIG. 5E, the plasma etching is stopped on the adhesive tape 506, with individualized portions 514A and 514B of the semiconductor wafer 501 separated by the trench 516.

In a specific embodiment, during the etch process the etch rate of the material of semiconductor wafer 501 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used, at least in theory, for example, if throughput is not of paramount importance.

In an exemplary embodiment, a deep silicon etch is used to etch a single crystalline silicon substrate or wafer 501 at an etch rate greater than approximately 40% of conventional silicon etch rates (e.g., 40 µm per minute, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $NF_3$, $SF_6$, $SiF_4$, $C_4F_8$, $CHF_3$, $XeF_2$, or any other reactant gas capable of etching silicon at a relatively fast etch rate.

In another embodiment, the laser scribing process singulates the dies, and a plasma etching operation may be performed to remove damaged semiconductor material resulting from the laser scribing process. For example, a plasma etch operation may remove a portion of semiconductor from the sidewalls of the scribed trenches. According to embodiments, the singulated dies need sufficiently high die break strengths to ensure reliable die pick and place and subsequent assembly processes. It has been found that the rough, damaged sidewalls present following the laser ablation operation may unacceptably reduce die break strength. However, it has also been found that the damage layer in a silicon substrate for a femtosecond laser is less than 3 µm thick and that a higher die break strength can be achieved by performing the plasma etch operation to remove a comparable thickness of semiconductor from sidewalls exposed by the trench 516. Vertical etch rates of 10 µm/min are expected with lateral etch rate being between 50 and 100% of that, depending on process conditions. As such, etch time is generally within 10 to 90 sec, depending on the desired undercut and/or remaining thickness of the substrate.

After singulation of the ICs, the method may involve removal of the mask 510, and operations for proceeding with packaging of the singulated ICs. Thus, FIGS. 2 and 3 illustrate methods of dicing including formation and baking of a mask with light sources.

Figure 7:
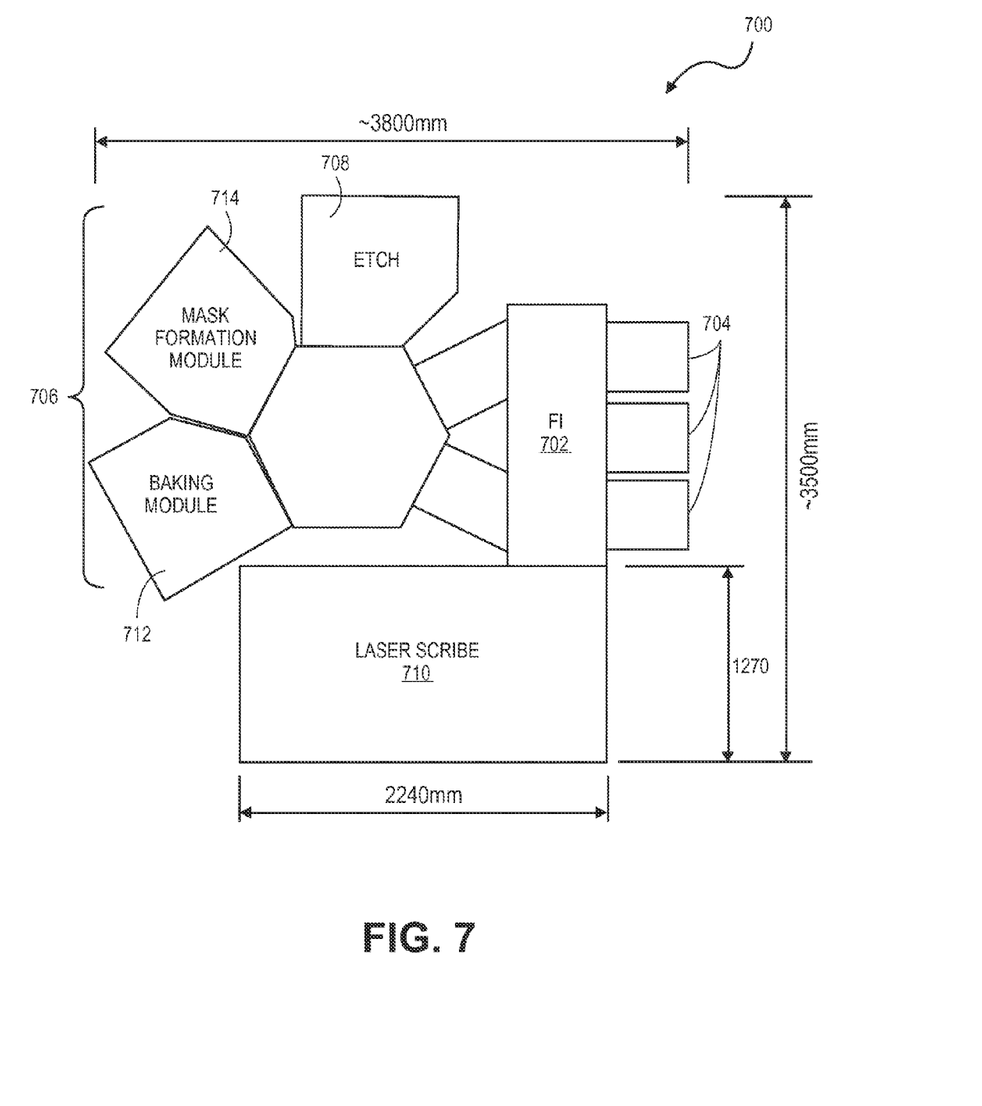
FIG. 7 illustrates a block diagram of a tool layout for laser and plasma dicing of substrates, including a baking module, in accordance with an embodiment of the present invention.

Turning to FIG. 7, a single integrated platform 700 may be configured to perform many or all of the operations in the dicing methods 200 of FIGS. 2 and 300 of FIG. 3. For example, FIG. 7 illustrates a block diagram of a cluster tool 706 coupled with laser scribe apparatus 710 for laser and plasma dicing of substrates, in accordance with an embodiment of the present invention. The cluster tool 706 is coupled to a factory interface 702 (FI) having a plurality of load locks 704. The factory interface 702 may be a suitable atmospheric port to interface between an outside manufacturing facility with laser scribe apparatus 710 and cluster tool 706. The factory interface 702 may include robots with arms or blades for transferring substrates (or carriers thereof) from storage units (such as front opening unified pods) into either cluster tool 706 or laser scribe apparatus 710, or both.

A laser scribe apparatus 710 is also coupled to the FI 702. In an embodiment, the laser scribe apparatus 710 includes a femtosecond laser operating in the 300-540 nm band. The femtosecond laser is configured to perform the laser ablation portion of the wafer dicing processes 200 of FIGS. 2 and 300 of FIG. 3. In one embodiment, a moveable stage is also included in laser scribe apparatus 710, the moveable stage configured for moving a wafer or substrate (or a carrier thereof) relative to the femtosecond-based laser. In a specific embodiment, the femtosecond laser is also moveable.

The cluster tool 706 includes one or more plasma etch chambers 708 coupled to the FI by a robotic transfer chamber housing a robotic arm for in-vaccuo transfer of substrates. The plasma etch chambers 708 is suitable for performing a plasma etch portion of the wafer dicing portion of the method 300 of FIG. 3. In one exemplary embodiment, the plasma etch chamber 708 is further coupled to an $SF_6$ gas source and at least one of a $C_4F_8$ and $C_4F_6$ source. In one embodiment, the plasma etch chamber 708 is coupled to an $SF_6$ gas source and at least one of a $C_4F_8$, $CF_4$, and $C_4F_6$ source. In a specific embodiment, the one or more plasma etch chambers 708 is an Applied Centura® Silvia™ Etch system, available from Applied Materials of Sunnyvale, Calif., USA, although other suitable etch systems are also available commercially. In an embodiment, more than one etch chamber 708 is included in the cluster tool 706 portion of integrated platform 700 to enable high manufacturing throughput of the singulation or dicing process.

According to the illustrated embodiment, the cluster tool 706 also includes a mask formation module 714. In one embodiment, the mask formation module 714 is a spin-coating module configured to perform a spin-coating method to coat a surface of a semiconductor wafer with a mask. Other embodiments may include a mask formation module configured to perform another technique of coating a wafer with a layer that involves subsequent heating. In the illustrated embodiment, the cluster tool 706 also includes a baking module (e.g., baking chamber) 712. In one embodiment, the baking module includes a support structure to hold the semiconductor wafer or substrate in the baking chamber, and one or more heat sources configured to heat the mask disposed over the semiconductor wafer or substrate, for example in accordance with the methods of baking described above. Although the mask formation module 714 and the baking module 712 are illustrated as a part of the cluster tool 706, in other embodiments, the mask formation module 714 and/or the baking module 712 may be located separately from the cluster tool 706.

Figure 8:
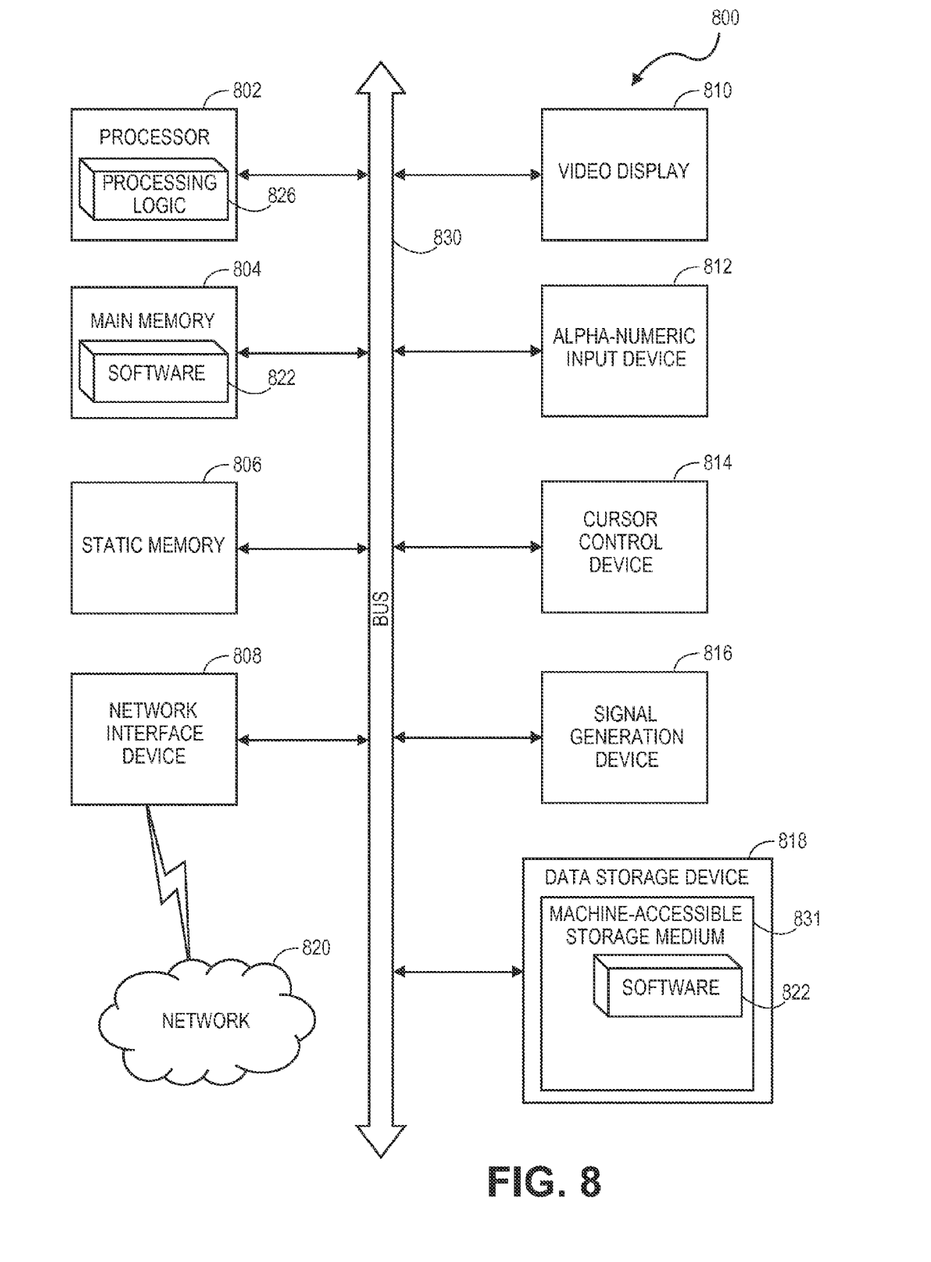
FIG. 8 illustrates a block diagram of an exemplary computer system which controls automated performance of one or more operations in the masking, baking, laser scribing, plasma dicing methods described herein, in accordance with an embodiment of the present invention.

FIG. 8 illustrates a computer system 800 within which a set of instructions, for causing the machine to execute one or more of the methods discussed herein may be executed. The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, etc. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations and steps discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 831 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. For example, although the baking methods and tools disclosed herein are described in the context of wafer dicing, the baking methods may be used in any semiconductor fabrication process involving drying or curing of a mask or other film. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a semiconductor wafer comprising integrated circuits (ICs), the method comprising:
    coating a surface of the semiconductor wafer to form a mask covering the ICs;
    baking the mask with radiation from one or more light sources that illuminate an entire upper surface of the mask; and
    patterning the mask with a laser scribing process to provide a patterned mask with gaps, exposing regions of the semiconductor wafer between the ICs.

2. The method of claim 1, further comprising:
    plasma etching the semiconductor wafer through the gaps in the patterned mask to singulate the ICs.

3. The method of claim 1, further comprising:
    laser scribing the semiconductor wafer through the gaps in the patterned mask to singulate the ICs.

4. The method of claim 1, wherein the one or more light sources are located above the semiconductor wafer.

5. The method of claim 1, wherein baking the mask comprises irradiating the mask with light having a first wavelength that is absorbed by the mask and a second wavelength that is transmitted by the mask.

6. The method of claim 1, wherein the one or more light sources emit light in the visible spectrum.

7. The method of claim 1, wherein the one or more light sources comprise an array of light emitting diodes (LEDs).

8. The method of claim 1, further comprising:
    simultaneously baking a plurality of masked semiconductor wafers with the same one or more light sources.

9. The method of claim 1, further comprising:
supporting the semiconductor wafer on a non-hot-plate stage while baking the mask with the one or more light sources.

10. The method of claim 1, further comprising:
supporting the semiconductor wafer on a heated stage while heating the mask with the one or more light sources.

11. The method of claim 1, further comprising:
supporting the semiconductor wafer in an oven chamber; and
heating an ambient gas in the oven chamber with heating elements while heating the mask with the one or more light sources.

12. The method of claim 11, wherein the heating elements are disposed at one or more locations around the semiconductor wafer without contacting a stage supporting the semiconductor wafer in the oven chamber.

13. A method of dicing a substrate comprising integrated circuits (ICs), the method comprising:
forming a mask over the substrate with a wet-coating process, the mask covering the ICs;
heating the mask with one or more light sources emitting light in the visible spectrum, drying the mask;
patterning the mask with a laser scribing process to provide a patterned mask with gaps, exposing regions of the substrate between the ICs; and
plasma etching the substrate through the gaps in the patterned mask.

14. The method of claim 13, wherein the one or more light sources are located above the substrate.

15. The method of claim 13, wherein heating the mask comprises irradiating the mask with light having a first wavelength that is absorbed by the mask and a second wavelength that is transmitted by the mask.

16. A method of dicing a semiconductor wafer comprising integrated circuits (ICs), the method comprising:
coating a surface of the semiconductor wafer to form a mask covering the ICs;
baking the mask with radiation in the visible spectrum from one or more light sources, wherein the one or more light sources illuminate an entire upper surface of the mask;
patterning the mask to provide a patterned mask with gaps, exposing regions of the semiconductor wafer between the ICs; and
etching the semiconductor wafer through the gaps in the patterned mask to singulate the ICs.

17. The method of claim 16, wherein patterning the mask comprises laser scribing the mask.

18. The method of claim 16, wherein etching the semiconductor wafer comprises plasma etching the semiconductor wafer through the gaps in the patterned mask to singulate the ICs.

19. The method of claim 16, wherein etching the semiconductor wafer comprises laser scribing the semiconductor wafer through the gaps in the patterned mask to singulate the ICs.

20. The method of claim 16, wherein the one or more light sources are located above the semiconductor wafer.

21. The method of claim 16, wherein baking the mask comprises irradiating the mask with light having a first wavelength that is absorbed by the mask and a second wavelength that is transmitted by the mask.

22. The method of claim 16, wherein the one or more light sources comprise an array of light emitting diodes (LEDs).

23. The method of claim 16, further comprising:
simultaneously baking a plurality of masked semiconductor wafers with the same one or more light sources.

24. The method of claim 16, further comprising:
supporting the semiconductor wafer on a non-hot-plate stage while baking the mask with the one or more light sources.

* * * * *